United States Patent
Horii et al.

(10) Patent No.: US 9,613,809 B2
(45) Date of Patent: Apr. 4, 2017

(54) METHOD OF MANUFACTURING SILICON CARBIDE SEMICONDUCTOR DEVICE

(71) Applicant: Sumitomo Electric Industries, Ltd., Osaka-shi (JP)

(72) Inventors: Taku Horii, Osaka (JP); Masaki Kijima, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/766,963

(22) PCT Filed: Jan. 17, 2014

(86) PCT No.: PCT/JP2014/050795
§ 371 (c)(1),
(2) Date: Aug. 10, 2015

(87) PCT Pub. No.: WO2014/136477
PCT Pub. Date: Sep. 12, 2014

(65) Prior Publication Data
US 2015/0380247 A1    Dec. 31, 2015

(30) Foreign Application Priority Data

Mar. 8, 2013    (JP) .................................. 2013-046890

(51) Int. Cl.
*H01L 21/04*    (2006.01)
*H01L 29/66*    (2006.01)
(Continued)

(52) U.S. Cl.
CPC ...... *H01L 21/0455* (2013.01); *H01L 21/0217* (2013.01); *H01L 21/0223* (2013.01);
(Continued)

(58) Field of Classification Search
CPC ............. H01L 21/0455; H01L 21/0465; H01L 21/0332; H01L 21/02271; H01L 21/02123;
(Continued)

(56) References Cited

U.S. PATENT DOCUMENTS

2012/0164810 A1    6/2012    Ooi et al.
2012/0184092 A1    7/2012    Ooi et al.
(Continued)

FOREIGN PATENT DOCUMENTS

EP    1 750 296 A2    2/2007
JP    49-019946    5/1974
(Continued)

OTHER PUBLICATIONS

International Search Report in PCT International Application No. PCT/JP2014/050795, dated Mar. 25, 2014.
(Continued)

*Primary Examiner* — Julio J Maldonado
*Assistant Examiner* — Stanetta Isaac
(74) *Attorney, Agent, or Firm* — Venable LLP; Michael A. Sartori; Laura G. Remus

(57) ABSTRACT

A method of manufacturing a silicon carbide semiconductor device includes the following steps. A silicon carbide substrate is prepared. A first mask layer is formed in contact with a first main surface of the silicon carbide substrate. The first mask layer includes a first layer disposed in contact with the first main surface, an etching stop layer disposed in contact with the first layer and made of a material different from that for the first layer, and a second layer disposed in contact with a surface of the etching stop layer opposite to the surface in contact with the first layer. A recess is formed in the first mask layer by etching the second layer and the etching stop layer. A first impurity region is formed in the
(Continued)

silicon carbide substrate using the first mask layer with the recess. The first mask layer does not include a metallic element.

12 Claims, 7 Drawing Sheets

(51) Int. Cl.
| | |
|---|---|
| *H01L 29/16* | (2006.01) |
| *H01L 29/78* | (2006.01) |
| *H01L 21/02* | (2006.01) |
| *H01L 21/311* | (2006.01) |
| *H01L 21/324* | (2006.01) |
| *H01L 29/06* | (2006.01) |
| *H01L 21/033* | (2006.01) |

(52) U.S. Cl.
CPC .. *H01L 21/02123* (2013.01); *H01L 21/02164* (2013.01); *H01L 21/02255* (2013.01); *H01L 21/02271* (2013.01); *H01L 21/0332* (2013.01); *H01L 21/046* (2013.01); *H01L 21/0465* (2013.01); *H01L 21/31144* (2013.01); *H01L 21/324* (2013.01); *H01L 29/0619* (2013.01); *H01L 29/1608* (2013.01); *H01L 29/66053* (2013.01); *H01L 29/66068* (2013.01); *H01L 29/7827* (2013.01)

(58) Field of Classification Search
CPC .......... H01L 29/0619; H01L 21/31144; H01L 21/324; H01L 21/02164; H01L 21/0223; H01L 21/02255; H01L 21/0217; H01L 21/046

See application file for complete search history.

(56) References Cited

U.S. PATENT DOCUMENTS

| | | |
|---|---|---|
| 2012/0217577 A1 | 8/2012 | Hashimoto et al. |
| 2012/0315746 A1 | 12/2012 | Yamada et al. |
| 2013/0009256 A1 | 1/2013 | Okumura et al. |
| 2013/0045593 A1 | 2/2013 | Ooi |

FOREIGN PATENT DOCUMENTS

| | | |
|---|---|---|
| JP | 2008-060105 A | 3/2008 |
| JP | 2012-004197 A | 1/2012 |
| JP | 2012-178389 A | 9/2012 |
| JP | 2012-253291 A | 12/2012 |
| JP | 2012-2253291 A | 12/2012 |
| JP | 2013-042050 A | 2/2013 |
| WO | WO 2012/086257 A1 | 6/2012 |
| WO | WO 2012/098759 A1 | 7/2012 |

OTHER PUBLICATIONS

Extended European Search Report in counterpart European Patent Application No. 14 76 0219.7, dated Sep. 27, 2016.
Notice of Grounds of Rejection in counterpart Japanese Patent Application No. 2013-046890, dated Nov. 8, 2016.

METHOD OF MANUFACTURING SILICON CARBIDE SEMICONDUCTOR DEVICE

TECHNICAL FIELD

The present invention relates to methods of manufacturing silicon carbide semiconductor devices, and more particularly to a method of manufacturing a silicon carbide semiconductor device capable of suppressing metal contamination.

BACKGROUND ART

In recent years, silicon carbide has been increasingly employed as a material for a semiconductor device such as a MOSFET (Metal Oxide Semiconductor Field Effect Transistor) in order to allow a higher breakdown voltage, lower loss, the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide is also advantageous in that performance degradation is small when used in a high-temperature environment as compared to a semiconductor device made of silicon.

For example, WO 2012/086257 (PTD 1) describes a method of manufacturing a MOSFET comprising steps of forming an etching stop layer made of titanium on a surface of a silicon carbide substrate, forming a patterned mask layer on the etching stop layer, and then implanting ions into the silicon carbide substrate using the mask layer.

CITATION LIST

Patent Document

PTD 1: WO 2012/086257

SUMMARY OF INVENTION

Technical Problem

According to the method of manufacturing a MOSFET described in WO 2012/086257, however, titanium is used for the etching stop layer. After the etching stop layer is formed, therefore, part of the titanium remains in the silicon carbide substrate, resulting in the occurrence of metal contamination in the silicon carbide semiconductor device. In a silicon semiconductor device made of silicon, a metallic element that has been mixed into a silicon substrate can be removed by gettering. In a silicon carbide semiconductor device, however, a metallic element cannot be removed by gettering. It is thus required to suppress metal contamination in a silicon carbide semiconductor device more than in a silicon semiconductor device.

The present invention has been made to solve the problem described above, and an object of the present invention is to provide a method of manufacturing a silicon carbide semiconductor device capable of suppressing metal contamination.

Solution to Problem

A method of manufacturing a silicon carbide semiconductor device according to the present invention includes the following steps. A silicon carbide substrate having a first main surface and a second main surface opposite to each other is prepared. A first mask layer is formed in contact with the first main surface of the silicon carbide substrate. The first mask layer includes a first layer disposed in contact with the first main surface, an etching stop layer disposed in contact with the first layer and made of a material different from that for the first layer, and a second layer disposed in contact with a surface of the etching stop layer opposite to the surface in contact with the first layer. A recess is formed in the first mask layer by etching the second layer and the etching stop layer. A first impurity region having a first conductivity type is formed in the silicon carbide substrate using the first mask layer with the recess. The first mask layer does not include a metallic element.

In the method of manufacturing a silicon carbide semiconductor device according to the present invention, the first mask layer does not include a metallic element. Thus, mixing of a metallic element into the silicon carbide substrate can be suppressed to reduce metal contamination of the silicon carbide semiconductor device.

Preferably, in the above method of manufacturing a silicon carbide semiconductor device, a second mask layer is formed on the second main surface of the silicon carbide substrate. Thus, adhesion of a metallic element to the second main surface of the silicon carbide substrate from outside can be suppressed. The second mask layer does not include a metallic element. Thus, mixing of a metallic element produced from the second mask layer into the silicon carbide substrate can be suppressed. Moreover, since the second main surface of the silicon carbide substrate is protected by the second mask layer, direct contact of the silicon carbide substrate with a metallic device and the like can be prevented.

Preferably, in the above method of manufacturing a silicon carbide semiconductor device, the second mask layer includes a third layer disposed in contact with the second main surface and made of a same material as that for the first layer, a fourth layer disposed in contact with the third layer and made of a same material as that for the etching stop layer, and a fifth layer disposed in contact with a surface of the fourth layer opposite to the surface in contact with the third layer and made of a same material as that for the second layer. Thus, the first mask layer and the second mask layer can be simultaneously formed on the silicon carbide substrate, thereby simplifying the process of manufacturing the silicon carbide semiconductor device.

Preferably, in the above method of manufacturing a silicon carbide semiconductor device, the first layer, the etching stop layer and the second layer are formed without generation of plasma. Thus, the occurrence of roughness of the first main surface of the silicon carbide substrate can be suppressed.

Preferably, in the above method of manufacturing a silicon carbide semiconductor device, the etching stop layer and the second layer are formed by thermal chemical vapor deposition. Thus, the etching stop layer and the second layer can be formed in a simple manner.

Preferably, in the above method of manufacturing a silicon carbide semiconductor device, the etching stop layer and the second layer are formed by low-pressure chemical vapor deposition. Thus, metal contamination of the silicon carbide semiconductor device can be effectively suppressed.

Preferably, in the above method of manufacturing a silicon carbide semiconductor device, the first layer is formed either by a method of thermally oxidizing the first main surface or by low-pressure thermal chemical vapor deposition. Thus, the first layer can be formed in a simple manner.

Preferably, in the above method of manufacturing a silicon carbide semiconductor device, the first layer is made of either silicon dioxide or silicon nitride. Thus, the first main surface of the silicon carbide substrate is effectively protected.

Preferably, in the above method of manufacturing a silicon carbide semiconductor device, the second layer is made of either silicon dioxide or silicon nitride. Thus, the second layer effectively functions as a mask layer for impurity introduction.

Preferably, in the above method of manufacturing a silicon carbide semiconductor device, the etching stop layer is made of polysilicon. Thus, in the step of forming the recess in the first mask layer, exposure of the first layer at a bottom wall surface of the recess can be effectively suppressed.

Preferably, in the above method of manufacturing a silicon carbide semiconductor device, after the step of forming the first impurity region, the first mask layer is removed. After the step of removing the first mask layer, activation annealing is performed on the silicon carbide substrate. Thus, damage to the first mask layer due to the high-temperature activation annealing can be prevented.

Preferably, in the above method of manufacturing a silicon carbide semiconductor device, after the step of forming the first impurity region, in the recess, a third mask layer with an opening having a width smaller than the recess is formed. A second impurity region having a second conductivity type different from the first conductivity type is formed in the first impurity region using the third mask layer. Thus, the second impurity region can be formed in the first impurity region with high position accuracy.

Preferably, in the above method of manufacturing a silicon carbide semiconductor device, after the step of forming the first impurity region, a fourth mask layer is formed in contact with the first layer. A guard ring portion having the first conductivity type is formed in the silicon carbide substrate using the fourth mask layer, with the first layer remaining in contact with the first main surface. Thus, the guard ring portion can be formed in the silicon carbide substrate while the first main surface is protected by the first layer.

Advantageous Effects of Invention

As is evident from the description above, according to the present invention, a method of manufacturing a silicon carbide semiconductor device capable of suppressing metal contamination can be provided.

DESCRIPTION OF EMBODIMENTS

Embodiments of the present invention will be described below with reference to the drawings. In the following drawings, the same or corresponding parts are designated by the same reference numbers and description thereof will not be repeated.

Figure 1:
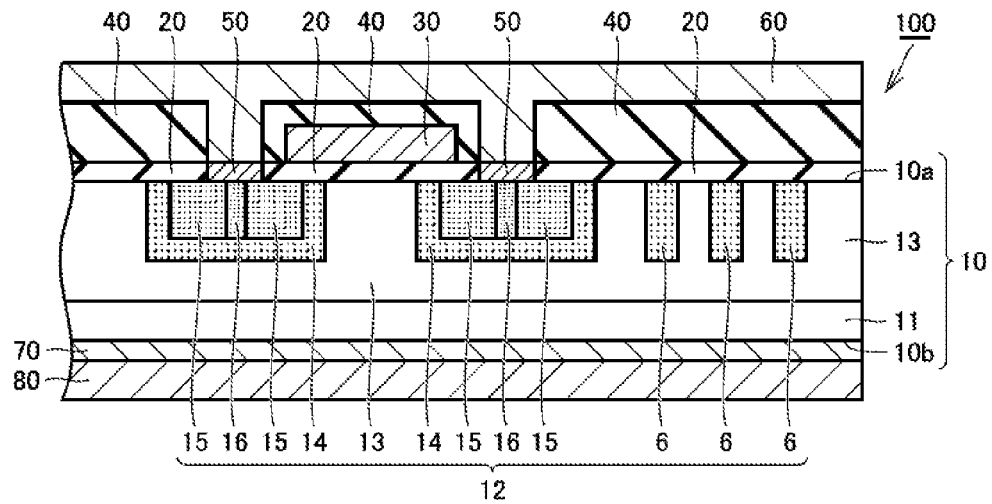
FIG. 1 is a schematic sectional view schematically showing the structure of a silicon carbide semiconductor device according to one embodiment of the present. invention.
Figure 2:
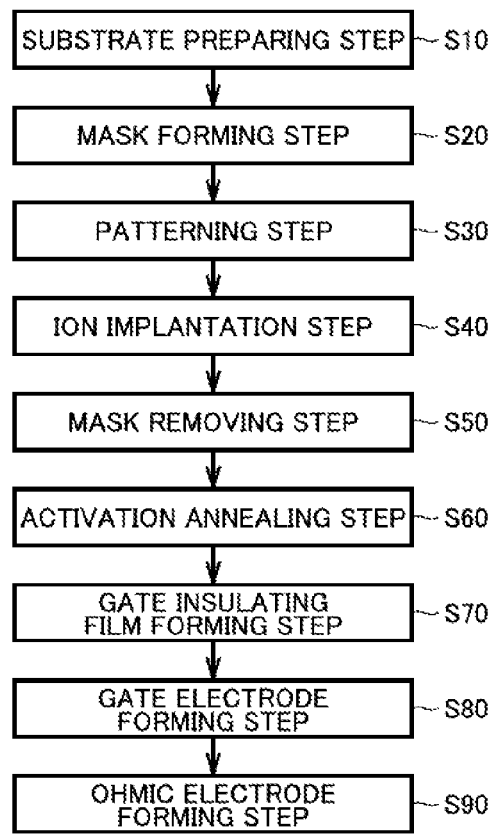
FIG. 2 is a flow diagram schematically showing a method of manufacturing the silicon carbide semiconductor device according to the embodiment of the present invention.

First, the structure of a MOSFET 100 as a silicon carbide semiconductor device according to this embodiment will be described. Referring to FIG. 1, MOSFET 100 mainly has a silicon carbide substrate 10, a gate insulating film 20, a gate electrode 30, an interlayer insulating film 40, source electrodes 50, a source electrode interconnect 60, a drain electrode 70, and a backside surface protecting electrode 80.

Silicon carbide substrate 10 includes a base substrate 11 and an epitaxial layer 12, where epitaxial layer 12 has a drift region 13, body regions 14, source regions 15 and p+ regions 16 formed therein.

Base substrate 11 is a substrate of n type conductivity (second conductivity type) by including an n type impurity such as N (nitrogen). Epitaxial layer 12 is an epitaxial growth layer formed on base substrate 11. Drift region 13 is a region of n type conductivity by including an n type impurity such as N (nitrogen), as with base substrate 11, with a concentration of the impurity being lower than in base substrate 11.

Body regions 14 (first impurity regions 14) include a first main surface 10a of silicon carbide substrate 10, and are formed separately from each other in epitaxial layer 12. Each of body regions 14 has p type conductivity (first conductivity type) by including a p type impurity such as Al (aluminum) or B (boron).

Source regions 15 (second impurity regions 15) are regions of n type conductivity (second conductivity type). Each of source regions 15 is formed in each of body regions 14 so as to include first main surface 10a and be surrounded by body region 14. Source region 15 has n type conductivity, as with base substrate 11 and drift region 13, by including an n type impurity such as P (phosphorous). A concentration of the type impurity included in source region 15 is higher than the concentration of the n type impurity included in drift region 13. Source region 15 is separated from drift region 13 by body region 14.

Each of p+ regions 16 is formed in each of body regions 14, as with source region 15, so as to include first main surface 10a, be surrounded by body region 14 and be adjacent to source region 15. P+ region 16 has p type conductivity by including a p type impurity such as Al (aluminum) or B (boron), as with body region 14. An impurity concentration in p+ region 16 is higher than in body region 14.

Gate insulating film 20 is made of silicon dioxide, for example, and formed to extend from an upper surface of one of source regions 15 to an upper surface of the other source region 15 while being in contact with first main surface 10a. Gate insulating film 20 is in contact with source regions 15, body regions 14 and drift region 13 on first main surface 10a.

Gate electrode 30 is formed to extend from above one of source regions 15 to above the other source region 15 while being in contact with gate insulating film 20. Gate electrode 30 is made of a conductor such as polysilicon doped with an impurity such as phosphorous. Gate electrode 30 is formed such that gate insulating film 20 is interposed between gate electrode 30 and silicon carbide substrate 10. Gate electrode 30 is disposed to face source regions 15 and body regions 14 with gate insulating film 20 interposed therebetween.

Interlayer insulating film 40 is made of a material including silicon dioxide, for example, and formed to surround gate electrode 30 on gate insulating film 20. Preferably, interlayer insulating film 40 is made of silicon dioxide not doped with an impurity such as phosphorous.

Each of source electrodes 50 is in contact with source region 15 and p+ region 16, and disposed in a second recess 29. Preferably, source electrode 50 is a film including Ti, Al and Si, and made of a TiAlSi alloy, for example. Source electrode 50 may be a film including Ni and Si, and made of a NiSi alloy, for example. Preferably, source electrode 50 is in ohmic contact with source region 15 and p+ region 16

Source electrode interconnect 60 is formed to cover source electrode 50 and interlayer insulating film 40. Source electrode interconnect 60 includes aluminum, for example, and is electrically connected to source electrode 50. Source electrode interconnect 60 has a thickness of 5 µm, for example. Preferably, source electrode interconnect 60 includes a first metal layer disposed in contact with source electrode 50. The first metal layer is preferably made of Ti (titanium). More preferably, source electrode interconnect 60 has a second metal layer disposed on and in contact with the first metal layer. The second metal layer is preferably made of TlN (titanium nitride) or TiW (titanium tungsten). The source electrode interconnect has a third metal layer disposed on and in contact with the second metal layer. The third metal layer is preferably made of AlSiCu (aluminum-silicon-copper).

Drain electrode 70 is formed in contact with a second main surface 10b of silicon carbide substrate 10. Drain electrode 70 may be made of a TiAlSi alloy, for example, as with source electrodes 50, or may be made of a NiSi alloy, for example. Drain electrode 70 is electrically connected to base substrate 11. Backside surface protecting electrode SO is provided in contact with drain electrode 70. Backside surface protecting electrode 80 may be made of Ti (titanium), Ni (nickel) and Ag (silver), or an alloy thereof for example.

Next, the operation of MOSFET 100 as a silicon carbide semiconductor device according to this embodiment will be described. Referring to FIG. 1, when a voltage applied to gate electrode 30 is lower than a threshold voltage, namely, in an off state, even if a voltage is applied between source electrode 50 and drain electrode 70, a pn junction formed between body region 14 and drill region 13 is reverse biased, resulting in a non-conducting state. When a voltage equal to or higher than the threshold voltage is applied to gate electrode 30, on the other hand, an inversion layer is formed in body region 14 As a result, source region 15 and drift region 13 are electrically connected together, causing a current to flow between source electrode 50 and drain electrode 70 MOSFET 100 operates in this manner.

Next, a method of manufacturing the silicon carbide semiconductor device according to the embodiment of the present invention will be described with reference to FIGS. 2 to 16 in the method of manufacturing the silicon carbide semiconductor device according to this embodiment, MOSFET 100 is manufactured as the silicon carbide semiconductor device according to this embodiment above.

Figure 3:
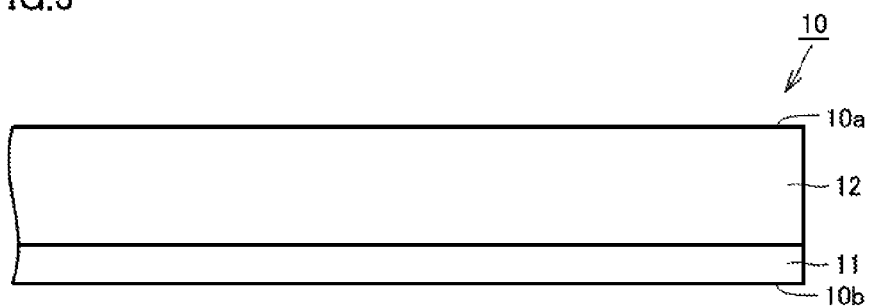
FIG. 3 is a schematic sectional view schematically showing a first step of the method of manufacturing the silicon carbide semiconductor device according to the embodiment of the present invention.

Referring to FIG. 3, a silicon carbide substrate preparing step (S10) is first performed. in this step (S10), base substrate 11 of n type conductivity (second conductivity type) is first prepared by slicing an ingot (not shown) made of hexagonal silicon carbide having a polytype of 4H, for example. Then, epitaxial layer 12 having n type conductivity and made of silicon, carbide is formed on base substrate Ii by epitaxial growth. Silicon carbide substrate 10 having first main surface 10a and second main surface 10b opposite to each other is thus formed.

Figure 4:
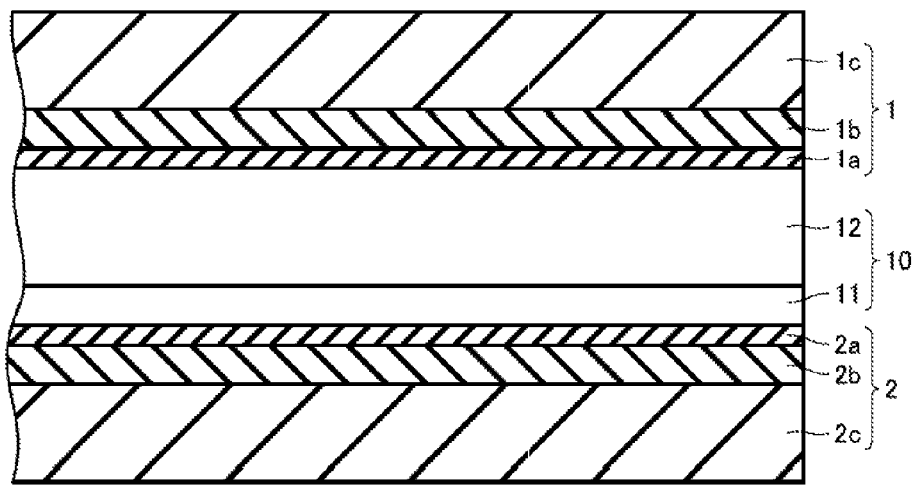
FIG. 4 is a schematic sectional view schematically showing a second step of the method of manufacturing the silicon carbide semiconductor device according to the embodiment of the present invention.
Figure 5:
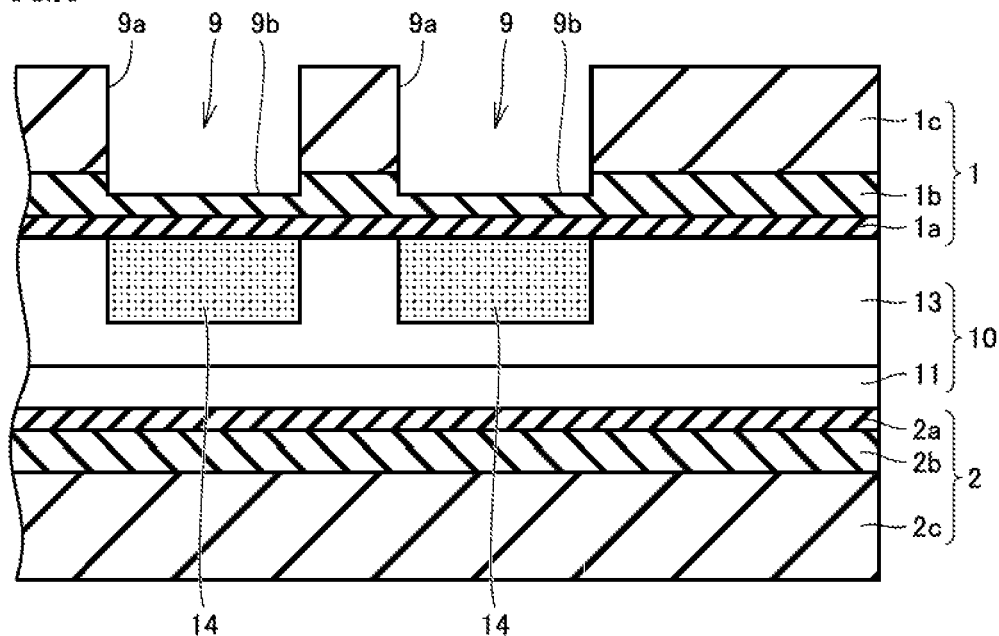
FIG. 5 is a schematic sectional view schematically showing a third step of the method of manufacturing the silicon carbide semiconductor device according to the embodiment of the present invention.
Figure 6:
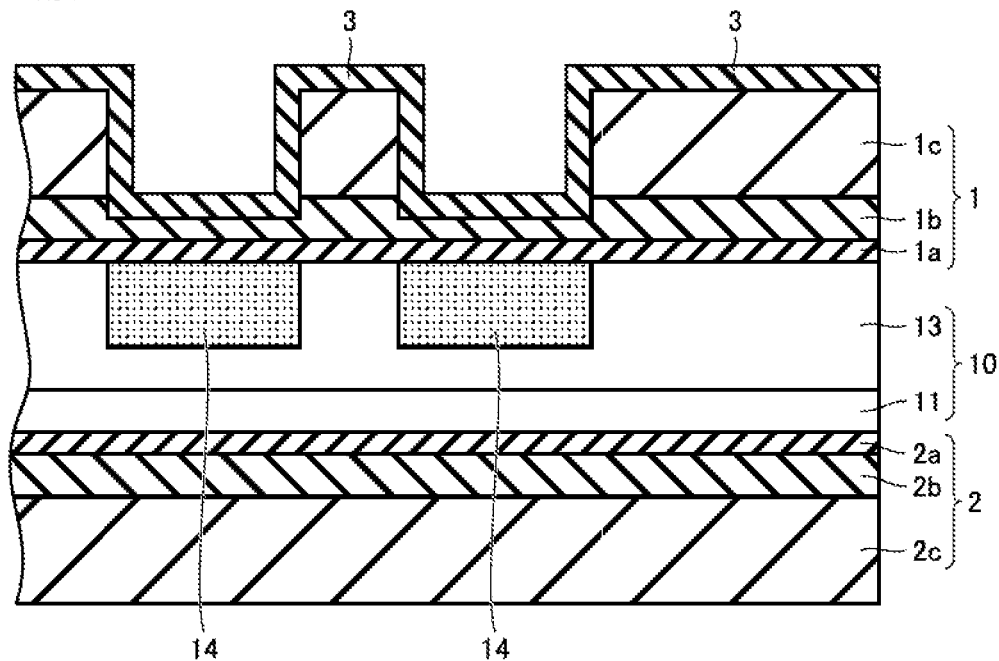
FIG. 6 is a schematic sectional view schematically showing a fourth step of the method of manufacturing the silicon carbide semiconductor device according to the embodiment of the present invention.

Next,. a mask forming step is performed as a step (S20). in this step (S20), referring to FIG. 4, a first mask layer 1 is formed in contact with first main surface 10a of silicon carbide substrate 10. First mask layer 1 includes a first layer 1a disposed in contact with first main surface 10a of silicon carbide substrate 10. Preferably, first layer 1a is made of either silicon dioxide or silicon nitride, and may be silicon nitride oxide. First layer 1a has a thickness of about 0.005 µm or more and 0.2 µm or less, for example. First mask layer 1 further includes an etching stop layer 1b disposed in contact with the first layer and made of a material different from that for the first layer.

Etching stop layer 1b is made of polysilicon, for example, and etching stop layer 1b has a thickness of about 0.1 µm or more and 1.0 µm or less, for example. Etching stop layer 1b may be silicon nitride. First mask layer 1 further includes a second layer 1c disposed in contact with a surface of etching stop layer 1b opposite to the surface in contact with first layer 1a. Preferably, second layer 1c is made of either silicon dioxide or silicon nitride, and may be silicon nitride oxide. Second layer 1c has a thickness of about 0.5 µm or more and 4.0 µm or less, for example.

Preferably, in the mask forming step, first mask layer 1 is formed in contact with first main surface 10a of silicon carbide substrate 10, and a second mask layer 2 is formed in contact with second main surface 10b of silicon carbide substrate 10. Second mask layer 2 may include a third layer 2a disposed on second main surface 10b and made of the same material as that for first layer 1a. Second mask layer 2 may further include a fourth layer 2b disposed in contact with third layer 2a and made of the same material as that for etching stop layer 1b. Second mask layer 2 may further include a fifth layer 2c disposed in contact with a surface of fourth layer 2b opposite to the surface in contact with third layer 2a and made of the same material as that for second layer 1c.

Preferably, first layer 1a and third layer 2a are simultaneously formed in contact with first main surface 10a and second main surface 10b of silicon carbide substrate 10, respectively. Preferably, etching stop layer 1b and fourth layer 2b are simultaneously formed in contact with first layer 1a and second layer 1c, respectively. More preferably, second layer 1c and fifth layer 2c are simultaneously formed in contact with etching stop layer 1b and fourth layer 2b. respectively. First layer 1a and second layer 1c may be made of the same material or different materials. Similarly, third layer 2a and fifth layer 2c may be made of the same material or different materials.

Preferably, at least one of first layer 1a, etching stop layer 1b, second layer 1c, third layer 2a, fourth layer 2b and fifth layer 2c is formed without generation of plasma, and more preferably, all of the layers are formed without generation of plasma. Examples of methods of forming the above layers without generation of plasma include thermal chemical vapor deposition and photochemical vapor deposition. Examples of the thermal chemical vapor deposition (thermal CVD) include atmospheric thermal CVD and low-pressure thermal CVD. Preferably, at least one of first layer 1a, etching stop layer 1b, second layer 1c, third layer 2a, fourth layer 2b and fifth layer 2c is formed by low-pressure thermal CVD, and more preferably, all of the layers are formed by low-pressure thermal CVD.

First layer 1a may be formed by thermal oxidation of first main surface 10a of silicon carbide substrate 10. Third layer 2a may he formed by thermal oxidation of second main surface 10b of silicon carbide substrate 10. That is, first layer 1a is preferably funned either by a method of thermally oxidizing first main surface 10a of silicon carbide substrate 10 or by low-pressure thermal CVD. Similarly, third layer 2a is preferably formed either by a method of thermally oxidizing second main surface 10b of silicon carbide substrate 10 or by low-pressure thermal CVD.

First layer 1a and second layer 1c forming first mask layer 1, and third layer 2a and fifth layer 2c forming second mask layer 2 can be manufactured by low-pressure thermal CVD, for example. Specifically, silicon dioxide layers can be formed by supplying TEOS (Tetraethylorthosilicate) gas at a flow rate of about 60 sccm or more and 100 sccm or less into a chamber in which silicon carbide substrate 10 has been placed and setting a pressure of about 0.8 Torr or more and 1.4 Torr or less, at a temperature of about 600° C. or more and 800° C. or less, for example.

Etching stop layer 1b and fourth layer 2b can be manufactured by low-pressure thermal CVD, for example. Specifically, polysilicon layers can be formed by supplying $SiH_4$ gas at a flow rate of about 800 sccm or more and 1200 sccm or less into the chamber in which silicon carbide substrate 10 has been placed and setting a pressure of about 0.4 Torr or more and 0.8 Torr or less, at a temperature of about 500° C. or more and 700° C. or less, for example.

First mask layer 1 does not include a metallic element. Specifically, each of first layer 1a, etching stop layer 1b and second layer 1c forming first mask layer 1 does not include a metallic element Preferably, second mask layer 2 does not include a metallic element, Specifically, each of third layer 2a, fourth layer 2b and fifth layer 2c forming second mask layer 2 does not include a metallic element. Preferably, the layers forming first mask layer 1 and the layers forming second mask layer 2 are made of non-metallic elements such as silicon. The metallic element as used herein, refers to alkali metal, alkaline-earth metal, and transition metal, for example, and more specifically, Ti (titanium), Fe (iron), Ni, (nickel), Co (cobalt), W (tungsten), and the like. That the mask layers such as first mask layer 1 and second mask layer 2 do not include a metallic element means that a concentration of a metallic element included m each of these mask layers is $1 \times 10^{11}$ atoms/cm$^2$ or less.

Next, a patterning step is performed as a step (S30). In this step (S30), second layer 1c and etching stop layer 1b of first mask layer 1 are etched with $CF_4$ or $CHF_3$, for example, to form recesses 9 in first mask layer 1 each having an opening at a position where body region 14 is formed. Each of recesses 9 has a side wall surface 9a and a bottom wall surface 9b. Side wall surface 9a of recess 9 is formed of second layer 1c and etching stop layer 1b, and bottom wall surface 9b of recess 9 is formed etching stop layer 1b. In other words, bottom wall surface 9b of recess 9 is located in etching stop layer 1b. Etching stop layer 1b is to prevent first layer 1a from being etched by the above etching. Etching stop layer 1b has higher etching resistance with respect to $CF_4$ or $CHF_3$ than second layer 1c.

Next, an ion implantation step is performed as a step (S40). In this step (S40), referring to FIG. 5, Al (aluminum) ions, for example, are implanted into silicon carbide substrate 10 using first mask layer 1 with recesses 9 as a mask, to form first impurity regions 14 as body regions in epitaxial layer 12 of silicon carbide substrate 10. First impurity regions 14 are p type (first conductivity type) regions. The Al ions are introduced into silicon carbide substrate 10 through etching stop layer 1b and first layer 1a. In portions where second layer 1c remains, very few of the Al ions are introduced into silicon carbide substrate 10 as the Al ions are masked by second layer 1c.

Next, a third mask layer forming step is performed. In this step, referring to FIG. 6, after first impurity regions 14 are formed in epitaxial layer 12 in the above ion implantation step, a third mask layer 3 is formed in contact with side wall surfaces 9a and bottom wall surfaces 9b of recesses 9 formed in first mask layer 1 and in contact with an upper surface of second layer 1c. In other words, third mask layer 3 is formed in contact with side wall surfaces 9a formed of second layer 1c and etching stop layer lb and in contact with bottom wall surfaces 9b formed of etching stop layer 1b. Third mask layer 3 is a silicon dioxide layer, for example.

Third mask layer 3 is formed by low-pressure CVD, for example. Preferably, third mask layer 3 does not include a metallic element.

Figure 7:
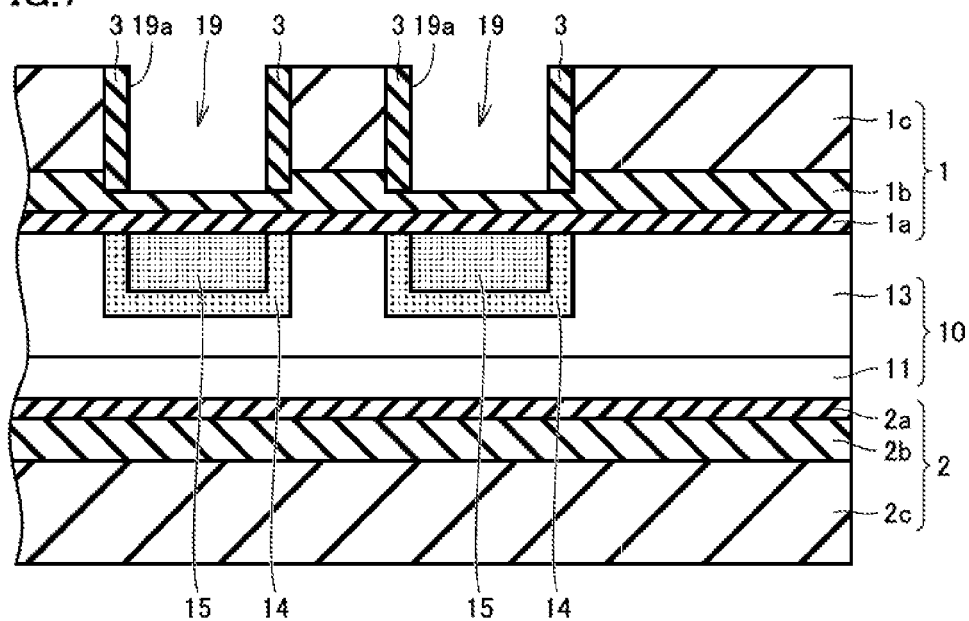
FIG. 7 is a schematic sectional view schematically showing a fifth step of the method of manufacturing the silicon carbide semiconductor device according to the embodiment of the present invention.

Next, referring to FIG. 7, anisotropic. etching is performed on third mask layer 3 from the side across third mask layer 3 from silicon carbide substrate 10, to remove part of third mask layer 3 from the upper surface of second layer 1c, and bottom wall surfaces 9b of recesses 9. Consequently, in each of recesses 9 formed in first mask layer 1, third mask layer 3 with an opening 19 having a dimension (namely, a width in a direction parallel to first main surface 10a) smaller than recess 9 is formed. Then, P (phosphorous) ions, for example, are implanted into each of body regions 14 as the first impurity regions of silicon carbide substrate 10 using third mask layer 3 and first mask layer 1 to a depth shallower than the depth to which the Al ions have been implanted, to form a source region as second impurity region 15. Second impurity region 15 has the second conductivity type (n type) different from the first conductivity type (p type), and is formed such that it is separated from n type drift region 13 by first impurity region 14.

In the method of manufacturing MOSFET 100 of this embodiment, first impurity regions 14 and second impurity regions 15 are formed while first main surface 10a of silicon carbide substrate 10 remains covered with first layer 1a. Preferably, first impurity regions 14, second impurity regions 15, p$^+$ regions 16 and guard ring regions 6 are formed while first main surface 10a of silicon carbide substrate 10 remains covered with first layer 1a.

Figure 8:
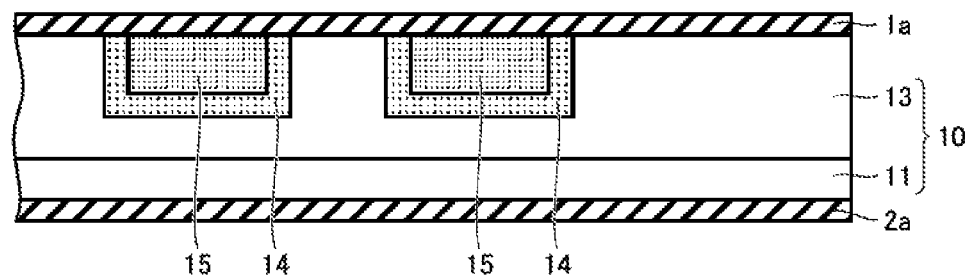
FIG. 8 is a schematic sectional view schematically showing a sixth step of the method of manufacturing the silicon carbide semiconductor device according to the embodiment of the present invention.

Next, a mask layer partially removing step is performed in the mask layer partially removing step, referring to FIG. 8, etching stop layer 1b formed in contact with first layer 1a, second layer 1c formed in contact with etching stop layer 1b, and third mask layer 3 formed in contact with etching stop layer 1b and second layer 1c are removed. Fourth layer 2b formed in contact with third layer 2a and fifth layer 2c formed in contact with fourth layer 2b may also be removed.

For example, the silicon dioxide layers serving as second layer 1c, fifth layer 2c and third mask layer 3 may be subjected to wet etching with hydrofluoric acid. For example, the polysilicon serving as etching stop layer 1b and fourth layer 2b may be removed by dry etching. Preferably, etching stop layer 1b, second layer 1c and third mask layer 3 are removed in such a manner that first layer 1a remains in contact with silicon carbide substrate 10. Preferably, fourth layer 2b and fifth layer 2c are removed in such a manner that third layer 2a remains in contact with silicon carbide substrate 10.

Figure 9:
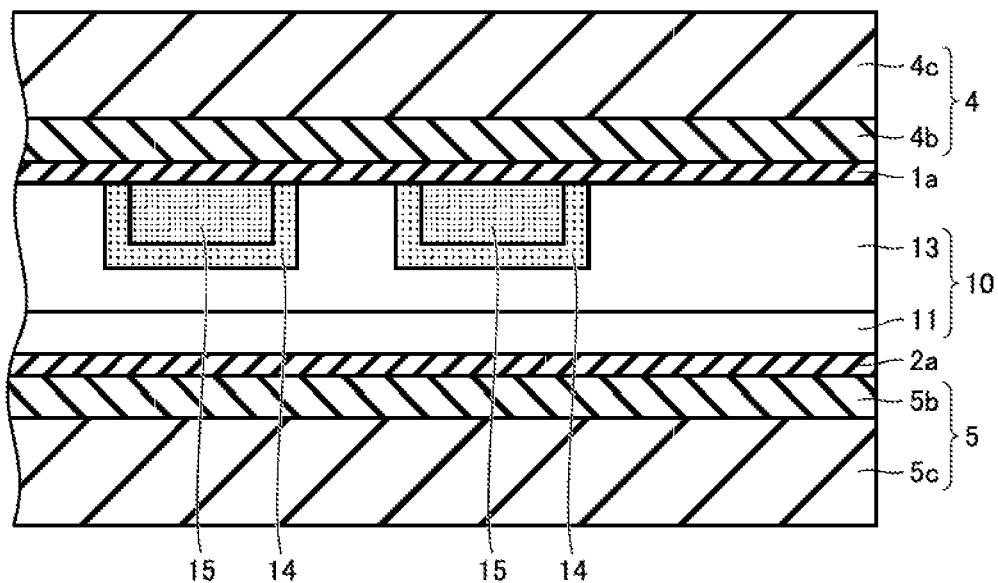
FIG. 9 is a schematic sectional view schematically showing a seventh step of the method of manufacturing the silicon carbide semiconductor device according to the embodiment of the present invention.
Figure 10:
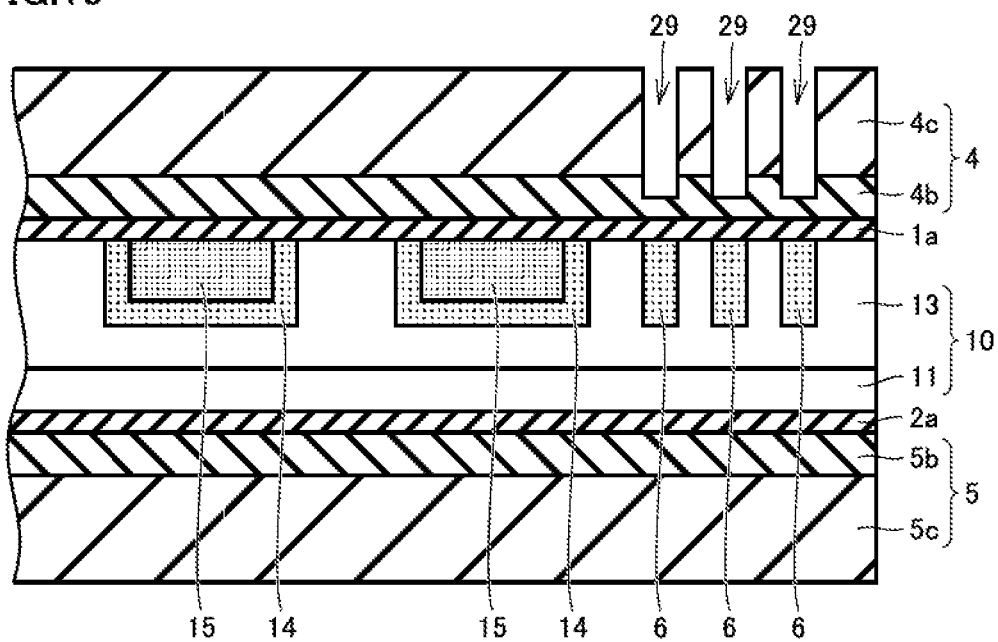
FIG. 10 is a schematic sectional view schematically showing an eighth step of the method of manufacturing the silicon carbide semiconductor device according to the embodiment of the present invention.
Figure 11:
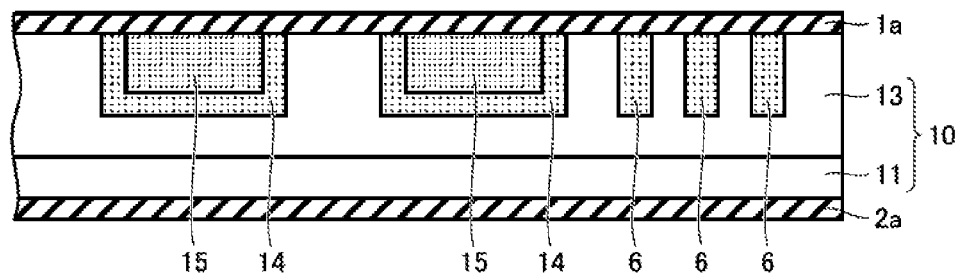
FIG. 11 is a schematic sectional view schematically showing a ninth step of the method of manufacturing the silicon carbide semiconductor device according to the embodiment of the present invention.
Figure 12:
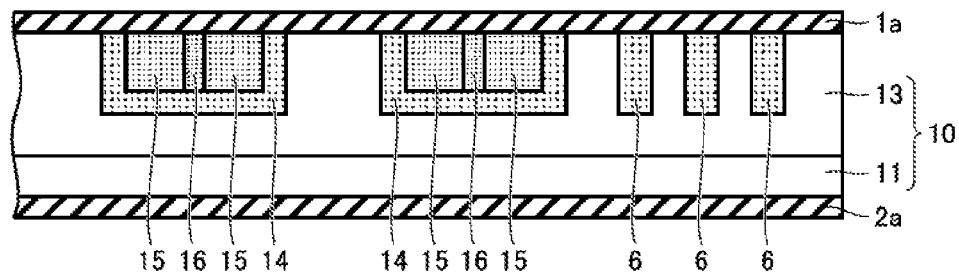
FIG. 12 is a schematic sectional view schematically showing a tenth step of the method of manufacturing the silicon carbide semiconductor device according to the embodiment of the present invention.
Figure 13:
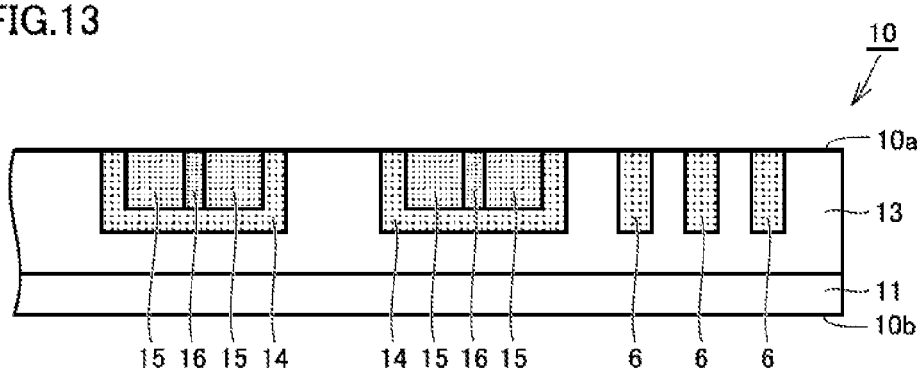
FIG. 13 is a schematic sectional view schematically showing an eleventh step of the method of manufacturing the silicon carbide semiconductor device according to the embodiment of the present invention.
Figure 14:
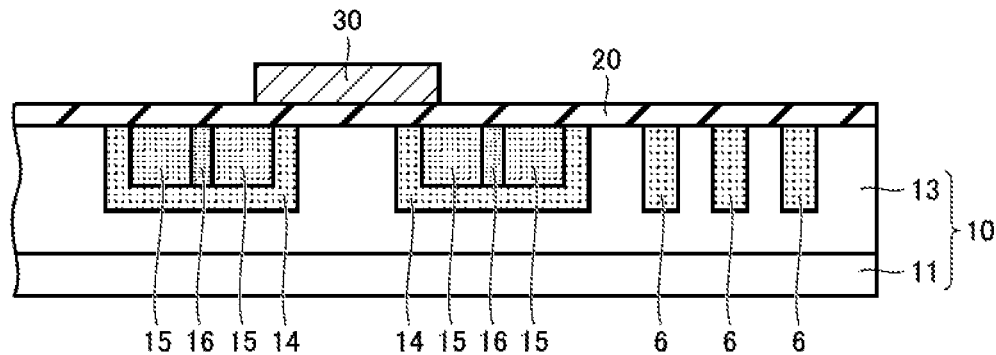
FIG. 14 is a schematic sectional view schematically showing a twelfth step of the method of manufacturing the silicon carbide semiconductor device according to the embodiment of the present invention.

In the mask layer partially removing step, etching stop layer 1b and second layer 1c may be removed with first layer 1a remaining in contact with first main surface .10a of silicon carbide substrate 10 as shown in FIG. 8, or first layer 1a may be removed along with etching stop layer 1b and second layer 1c to expose first main surface 10a of silicon carbide substrate 10 as shown in FIG. 9. Third layer 2a may be removed along with fourth layer 2b and fifth layer 2c to expose second main surface 10b of silicon carbide substrate 10.

Next, referring to FIG. 9, a fourth mask layer forming step is performed. In the fourth mask layer forming step, a fourth mask layer 4 is formed in contact with first layer 1a of first mask layer. Fourth mask layer 4 preferably includes a sigh layer 4b in contact with first layer 1a, and a seventh layer 4c in contact with sixth layer 4b opposite to first layer 1a. A material for sixth layer 4b may be the same as the material for etching stop layer 1b. A material for seventh layer 4c may be the same as the material for second layer 1c.

Similarly, a fifth mask layer 5 may be formed in contact with third layer 2a of second mask layer 2, Fifth mask layer 5 preferably includes an eighth layer 5b in contact with third layer 2a, and a ninth layer 5c in contact with eighth layer 5b opposite to third layer 2a. A material for eighth layer 5b may be the same as the material for etching stop layer 1b. A material for ninth layer 5c may be the same as the material for second layer 1c. Preferably, fourth mask layer 4 and fifth mask layer 5 are simultaneously formed, Preferably, sixth layer 4b and eighth layer 5b are simultaneously formed, and seventh layer 4c and ninth layer 5c are simultaneously formed. Preferably fourth mask layer 4 and fifth mask layer 5 do not include a metallic element.

Next, a step of patterning the fourth mask layer is performed. In the step of patterning the fourth mask layer, second recesses 29 are formed on an outer peripheral side of silicon carbide substrate 10. A side wall surface of each of second recesses 29 may be formed of sixth layer 4b and seventh layer 4c, and a bottom wall surface each of second recesses 29 may be formed of sixth layer 4b. Second recesses 29 may be singular or plural in number, If there are a plurality of second recesses 29, second recesses 29 may be similar in shape when viewed from the direction of the normal of first main surface 10a.

Next, a guard ring region forming step is performed. Specifically, referring to FIG. 10, Al ions, for example, are implanted into epitaxial layer 12 of silicon carbide substrate 10 using fourth mask layer 4 that has been patterned in the above step of patterning the fourth mask layer and first layer 1a of first mask layer 1, to form guard ring regions 6. Guard ring regions 6 are formed to surround body regions 14 on the outer peripheral side of silicon carbide substrate 10. Next, referring to FIG. 11, sixth layer 4b and seventh layer 4c forming fourth mask layer 4 are removed. Similarly, eighth layer 5b and ninth layer 5c forming fifth mask layer 5 may be removed. Then, a sixth mask layer (not shown) is formed with openings above the positions where regions 16 in contact with source regions 15 and body regions 14 are to be formed. P$^+$ regions 16 may be formed by implanting Al ions, for example, into source regions 15 using the sixth mask layer. Then, referring to FIG. 12, the sixth mask layer is removed to thereby form silicon carbide substrate 10 which has first main surface 10a covered with first layer 1a, and includes first impurity regions 14, second impurity regions 15, regions 16 and guard ring regions 6 formed therein. Preferably, the sixth mask layer does not include a metallic element.

Next, a mask layer removing step is performed as a step (S50). In this step, referring to FIG. 13, first layer 1a of first mask layer 1 is removed, from first main surface 10a of silicon carbide substrate 10, and third layer 2a of second mask layer 2 is removed from second main surface 10b. Consequently, body regions 14, source regions 15, p$^+$ regions 16 and guard ring regions 6 formed in silicon carbide substrate 10 are exposed at first main surface 10a.

Next, an activation annealing step is performed as a step (S60). In this step, silicon carbide substrate 10 having body regions 14, source regions 15, p$^+$ regions 16 and guard ring regions 6 formed therein is heated to about 1800° C. in an argon atmosphere, for example, to activate the impurities introduced into body regions 14, source regions 15, p$^+$ regions 16 and guard ring regions 6. Consequently, desired carriers are generated in the regions where the impurities have been introduced.

Next, a gate insulating film forming step is performed as a step (S70). In this step (S70), referring to FIG. 14, silicon carbide substrate 10 is heated to about 1300° C. in an atmosphere including oxygen, for example, to form gate insulating film 20 made of silicon dioxide in contact with first main surface 10a of silicon carbide substrate 10. Gate insulating film 20 is provided in contact with body regions 14, source regions 15, p+ regions 16 and guard ring regions 6 exposed at first main surface 10a.

Next, a gate electrode forming step is performed as a step (S80). In this step (S80), referring to FIG. 15, gate electrode 30 made of polysilicon including an impurity such as phosphorous is formed on and in contact with gate insulating film 20 by low-pressure CVD, for example. Gate electrode 30 is formed to face source regions 15 and body regions 14 on gate insulating film 20. Then, interlayer insulating film 40 is formed in contact with gate electrode 30 and gate insulating film 20 by P (Plasma)-CVD, for example, so as to surround gate electrode 30. Interlayer insulating film 40 is made of silicon dioxide, for example.

Figure 15:
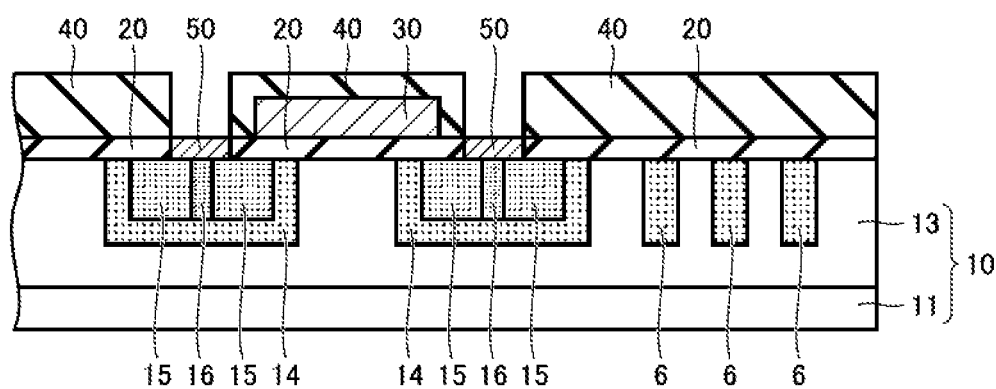
FIG. 15 is a schematic sectional view schematically showing a thirteenth step of the method of manufacturing the silicon carbide semiconductor device according to the embodiment of the present invention.
Figure 16:
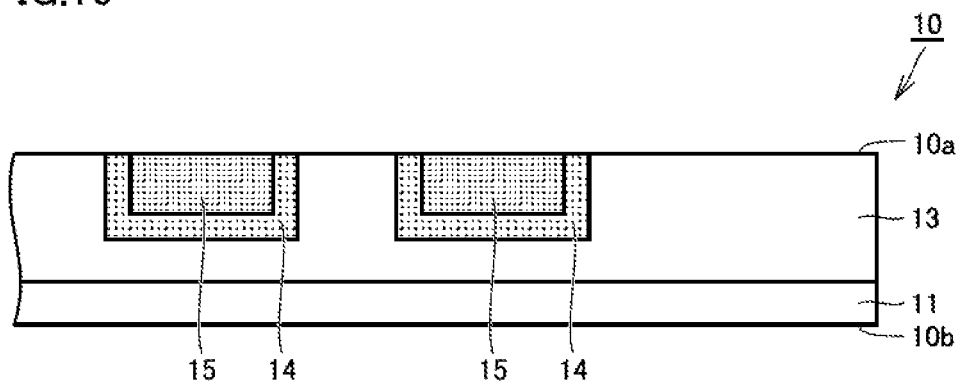
FIG. 16 is a schematic sectional view schematically showing a variation of the eleventh step of the method of manufacturing the silicon carbide semiconductor device according to the embodiment of the present invention.

Next, an ohmic electrode forming step is performed as a step (S90). In this step (S90), gate insulating film 20 and interlayer insulating film 40 formed to face source regions 15 and regions 16 are removed by dry etching, for example. Referring to FIG. 15, a metal film including Ti, Al and Si, for example, is formed in contact with source regions 15, p+ regions 16 and gate insulating film 20 by sputtering, for example. Then, silicon carbide substrate 10 having the metal film formed thereon is heated to about 1000° C., for example, to alloy the metal film and form source electrodes 50 in ohmic contact with silicon carbide substrate 10. Then, source electrode interconnect 60 is formed such that it is electrically connected to source electrodes 50. Source electrode interconnect 60 includes aluminum, for example, and may be formed to cover interlayer insulating film 40. Drain electrode 70 is formed in contact with second main surface 10b of silicon carbide substrate 10, and backside surface protecting electrode 80 electrically connected to drain electrode 70 is formed. MOSFET 100 according to this embodiment is manufactured in this manner.

Although a planar type MOSFET has been described as an example of the silicon carbide semiconductor device in this embodiment, the silicon carbide semiconductor device may be a trench type MOSFET. Alternatively, the silicon carbide semiconductor device may be an IGBT (Insulated Gate Bipolar Transistor) or an SBD (Schottky Barrier Diode). Although the p type and the n type have been described as the first conductivity type and the second conductivity type in this embodiment, the p type and the n type may be the second conductivity type and the first conductivity type, respectively. Although the method of manufacturing the silicon carbide semiconductor device has been described as forming the p+ regions after the step of forming the guard ring regions in this embodiment, the guard ring regions may be formed after the p+ regions are formed.

A function and effect of the method of manufacturing the silicon carbide semiconductor device according to this embodiment is now described.

According to the method of manufacturing MOSFET 100 of this embodiment, first mask layer 1 does not include a metallic element. Thus, mixing of a metallic element into silicon carbide substrate 10 can be suppressed to reduce metal contamination of MOSFET 100.

Further, according to the method of manufacturing MOSFET 100 of this embodiment, second mask layer 2 is formed on second main surface 10b of silicon carbide substrate 10. Second mask layer 2 does not include a metallic element. Thus, adhesion of a metallic element to second main surface 10b of silicon carbide substrate 10 from outside can be suppressed. Further, since second mask layer 2 does not include a metallic element, mixing of a metallic element produced from second mask layer 2 into silicon carbide substrate 10 can be suppressed. Moreover, since second main surface 10b of silicon carbide substrate 10 is protected by second mask layer 2, direct contact of silicon carbide substrate 10 with a metallic, device and the like can be prevented.

Further, according to the method of manufacturing MOSFET 100 of this embodiment, second mask layer 2 includes third layer 2a disposed in contact with second main surface 10b and made of the same material as that for first layer 1a, fourth layer 2b disposed in contact with third layer 2a and made of the same material as that for etching stop layer 1b, and fifth layer 2c disposed in contact with the surface of fourth layer 2b opposite to the surface in contact with third layer 2a and made of the same material as that for second layer 1c. Thus, first mask layer 1 and second mask layer 2 can be simultaneously formed on the silicon carbide substrate, thereby simplifying the process of manufacturing MOSFET 100.

Further, according to the method of manufacturing MOSFET 100 of this embodiment, first layer 1a, etching stop layer 1b and second layer 1c are formed without generation of plasma. Thus, the occurrence of roughness of first main surface 10a of silicon carbide substrate 10 can be suppressed.

Further, according to the method of manufacturing MOSFET 100 of this embodiment, etching stop layer 1b and second layer 1c are formed by thermal chemical vapor deposition. Thus, etching stop layer 1b and second layer 1c can be formed in a simple manner.

Further, according to the method of manufacturing MOSFET 100 of this embodiment, etching stop layer 1b and second layer 1c are formed by low-pressure chemical vapor deposition. Thus, metal contamination of MOSFET 100 can be effectively suppressed.

Further, according to the method of manufacturing MOSFET 100 of this embodiment, first layer 1a is formed either by a method of thermally oxidizing first main surface 10a or by low-pressure thermal chemical vapor deposition. Thus, first layer 1a can be formed in a simple manner.

Further, according to the method of manufacturing MOSFET 100 of this embodiment, first layer 1a is made of either silicon dioxide or silicon nitride. Thus, first main surface 10a of silicon carbide substrate 10 is effectively protected.

Further, according to the method of manufacturing MOSFET 100 of this embodiment, second layer 1c is made of either silicon dioxide or silicon nitride. Thus, second layer 1c effectively functions as a mask layer for impurity introduction.

Further, according to the method of manufacturing MOSFET 100 of this embodiment, etching stop layer 1b is made of polysilicon. Thus, in the step of forming recesses 9 in first mask layer 1, exposure of first layer 1a at bottom wall surfaces 9b of recesses 9 can be effectively suppressed.

Further, according to the method of manufacturing MOSFET 100 of this embodiment, after the step of removing first mask layer 1, activation annealing is performed on silicon carbide substrate 10. Thus, damage to first mask layer 1 due to the high-temperature activation annealing can be prevented.

Further, according to the method of manufacturing MOSFET 100 of this embodiment, after the step of forming first impurity regions 15, in each of recesses 9, third mask layer 3 with opening 19 having a width smaller than recess 9 is formed. N type second impurity regions 15 are formed in first impurity regions 14 using third mask layer 3. Thus, second impurity regions 15 can be formed in first impurity regions 14 with high position accuracy.

Further, according to the method of manufacturing MOSFET 100 of this embodiment, after the step of forming first impurity regions 14, fourth mask layer 4 is formed in contact with first layer 1a. P type guard ring regions 6 are formed in silicon carbide substrate 10 using fourth mask layer 4, with first layer 1a remaining in contact with first main surface 10a. Thus, guard ring regions 6 can be formed in silicon carbide substrate 10 while first main surface 10a is protected by first layer 1a.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 first mask layer; 1a first layer; 1b etching stop layer; 1c second layer; 2 second mask layer; 2a third layer; 2b fourth layer; 2c fifth layer; 3 third mask layer; 4 fourth mask layer; 4b sixth layer; 4c seventh layer; 5 filth mask layer; 5b eighth layer; 5c ninth layer; 6 guard ring region; 9 recess; 9a side wall surface, 9b bottom wall surface; 10 silicon, carbide substrate, 10a first main surface; 10b second main surface; 11 base substrate; 12 epitaxial layer; 13 drift region; 14 first impurity region (body region); 15 second impurity region (source region); 16 $p^+$ region; 19 opening; 20 gate insulating film; 29 second recess; 30 gate electrode; 40 interlayer insulating film; 50 source electrode; 60 source electrode interconnect; 70 drain electrode; 80 backside surface protecting electrode; 100 MOSFET.

The invention claimed is:

1. A method of manufacturing a silicon carbide semiconductor device, comprising steps of:
    preparing a silicon carbide substrate having a first main surface and a second main surface opposite to each other;
    forming a first mask layer in contact with said first main surface of said silicon carbide substrate, said first mask layer including a first layer disposed in contact with said first main surface, an etching stop layer disposed in contact with said first layer and made of a material different from that for said first layer, and a second layer disposed in contact with a surface of said etching stop layer opposite to the surface in contact with said first layer;
    forming a recess in said first mask layer by etching said second layer and said etching stop layer; and
    forming a first impurity region having a first conductivity type in said silicon carbide substrate using said first mask layer with said recess, said first mask layer not including a metallic element, and
    further comprising a step of forming a second mask layer on said second main surface of said silicon carbide substrate, said second mask layer not including a metallic element.

2. The method of manufacturing a silicon carbide semiconductor device according to claim 1, wherein
    said second mask layer includes a third layer disposed in contact with said second main surface and made of a same material as that for said first layer, a fourth layer disposed in contact with said third layer and made of a same material as that for said etching stop layer, and a fifth layer disposed in contact with a surface of said fourth layer opposite to the surface in contact with said third layer and made of a same material as that for said second layer.

3. The method of manufacturing a silicon carbide semiconductor device according to claim 1, wherein
    said first layer, said etching stop layer and said second layer are formed without generation of plasma.

4. The method of manufacturing a silicon carbide semiconductor device according to claim 3, wherein
    said etching stop layer and said second layer are formed by thermal chemical vapor deposition.

5. The method of manufacturing a silicon carbide semiconductor device according to claim 4, wherein
    said etching stop layer and said second layer are formed by low-pressure thermal chemical vapor deposition.

6. The method of manufacturing a silicon carbide semiconductor device according to claim 3, wherein
    said first layer is formed either by a method of thermally oxidizing said first main surface or by low-pressure chemical vapor deposition.

7. The method of manufacturing a silicon carbide semiconductor device according to claim 1, wherein
    said first layer is made of either silicon dioxide or silicon nitride.

8. The method of manufacturing a silicon carbide semiconductor device according to claim 1, wherein
    said second layer is made of either silicon dioxide or silicon nitride.

9. The method of manufacturing a silicon carbide semiconductor device according to claim 1, wherein
    said etching stop layer is made of polysilicon.

10. The method of manufacturing a silicon carbide semiconductor device according to claim 1, further comprising steps of:
    after said step of forming a first impurity region, removing said first mask layer; and
    after said step of removing said first mask layer, performing activation annealing on said silicon carbide substrate.

11. The method of manufacturing a silicon carbide semiconductor device according to claim 1, further comprising steps of:
    after said step of forming a first impurity region, forming, in said recess, a third mask layer with an opening having a width smaller than said recess; and
    forming a second impurity region having a second conductivity type different from said first conductivity type in said first impurity region using said third mask layer.

12. The method of manufacturing a silicon carbide semiconductor device according to claim 1, further comprising steps of:
    after said step of forming a first impurity region, forming a fourth mask layer in contact with said first layer; and
    forming a guard ring region having said first conductivity type in said silicon carbide substrate using said fourth mask layer, with said first layer remaining in contact with said first main surface.

* * * * *